(12) United States Patent
Hwang et al.

(10) Patent No.: US 11,978,733 B2
(45) Date of Patent: May 7, 2024

(54) HIGH-VOLTAGE ELECTROSTATIC DISCHARGE DEVICES

(71) Applicant: GLOBALFOUNDRIES Singapore Pte. Ltd., Singapore (SG)

(72) Inventors: Kyong Jin Hwang, Singapore (SG); Milova Paul, Singapore (SG); Sagar P. Karalkar, Singapore (SG); Robert J. Gauthier, Jr., Williston, VT (US)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 66 days.

(21) Appl. No.: 17/394,723

(22) Filed: Aug. 5, 2021

(65) Prior Publication Data
US 2023/0039286 A1 Feb. 9, 2023

(51) Int. Cl.
*H01L 27/02* (2006.01)
(52) U.S. Cl.
CPC .............. *H01L 27/0262* (2013.01)
(58) Field of Classification Search
CPC ........... H01L 27/0262; H01L 29/66136; H01L 29/87; H01L 27/0248; H01L 21/8224; H01L 21/82285; H01L 27/0652; H01L 27/0658; H01L 27/0664; H01L 27/0716; H01L 27/0755–0777; H01L 27/0821; H01L 27/0823–0828; H01L 29/732–7327; H01L 29/7371–7378; H01L 2924/13024; H01L 2924/13034–13035
See application file for complete search history.

(56) References Cited

U.S. PATENT DOCUMENTS

| | | |
|---|---|---|
| 5,516,709 A | 5/1996 | Yamazaki |
| 5,998,854 A | 12/1999 | Morishita et al. |
| 6,960,792 B1 | 11/2005 | Nguyen |
| 7,910,951 B2 | 3/2011 | Vashchenko |
| 8,049,247 B2 | 11/2011 | Tseng et al. |
| 8,129,788 B1 | 3/2012 | Walker et al. |
| 8,994,068 B2 | 3/2015 | Zhan et al. |
| 9,431,389 B2 | 8/2016 | Hwang et al. |
| 9,825,020 B2 | 11/2017 | Besse et al. |

(Continued)

FOREIGN PATENT DOCUMENTS

| | | |
|---|---|---|
| TW | 200644212 | 12/2006 |
| TW | 201340286 | 10/2013 |
| TW | 201539745 | 10/2015 |

OTHER PUBLICATIONS

Chen et al., "Optimization on MOS-Triggered SCR Structures for On-Chip ESD Protection", IEEE Transactions on Electron Devices, vol. 56, No. 7, Jul. 2009, 7 pages.

(Continued)

*Primary Examiner* — Wasiul Haider
(74) *Attorney, Agent, or Firm* — Francois Pagette; Andrew M. Calderon; Calderon Safran & Cole, P.C.

(57) ABSTRACT

The present disclosure relates to semiconductor structures and, more particularly, to high-voltage electrostatic discharge (ESD) devices and methods of manufacture. The structure comprising a vertical silicon controlled rectifier (SCR) connecting to an anode, and comprising a buried layer of a first dopant type in electrical contact with an underlying continuous layer of a second dopant type within a substrate.

16 Claims, 6 Drawing Sheets

(56) References Cited

U.S. PATENT DOCUMENTS

| | | | |
|---|---|---|---|
| 10,170,907 | B2 | 1/2019 | Lai |
| 10,361,185 | B2 | 7/2019 | Zhan et al. |
| 2004/0129983 | A1 | 7/2004 | Mallikarjunaswamy |
| 2005/0167753 | A1 | 8/2005 | Mallikarjunaswamy et al. |
| 2014/0061740 | A1 | 3/2014 | Ho |
| 2015/0028385 | A1 | 1/2015 | Miyoshi et al. |
| 2015/0325570 | A1 | 11/2015 | Chen et al. |
| 2016/0155737 | A1 | 6/2016 | Linewih |
| 2017/0194314 | A1* | 7/2017 | Lee ................. H01L 29/7436 |
| 2018/0247925 | A1 | 8/2018 | Salman et al. |
| 2019/0051646 | A1 | 2/2019 | Salcedo et al. |
| 2019/0312026 | A1 | 10/2019 | Zhan |
| 2020/0266303 | A1* | 8/2020 | Sai ................. H01L 27/0255 |
| 2022/0223584 | A1* | 7/2022 | Appaswamy ....... H01L 21/8222 |
| 2023/0039286 | A1 | 2/2023 | Hwang |
| 2023/0078157 | A1 | 3/2023 | Hwang |
| 2023/0121127 | A1 | 4/2023 | Hwang |

OTHER PUBLICATIONS

A. Ferrara et al., "The Boost Transistor: a Field Plate Controlled LDMOST", IEEE 27th International Symposium on Power Semiconductor Devices & IC's (ISPSD), 2015, 4 pages.

C. Duvvury et al., "Device Integration for ESD Robustness of High Voltage Power MOSFETs", Proceedings of 1994 IEEE International Electron Devices Meeting, 1994, pp. 407-410, doi: 10.1109/IEDM. 1994.383381, 4 pages.

Specification and drawings for U.S. Appl. No. 17/501,270, filed Oct. 14, 2021, 28 pages.

Specification and drawings for U.S. Appl. No. 18/308,322, filed Apr. 27, 2023, 24 pages.

Taiwanese Office Action in related TW Application No. 111134635 dated Jun. 13, 2023, 7 pages.

Koo et al., "The design of high holding voltage SCR for Whole-chip ESD protection", IEICE Electronics Express, vol. 5, No. 17, Sep. 10, 2008, 7 pages.

Specification and drawings for U.S. Appl. No. 17/475,942, filed Sep. 15, 2021, 28 pages.

Jin-Woo Jung, et al., "A Design of BJT-based ESD Protection Device combining SCR for High Voltage Power Clamps", Journal of Semiconductor Technology and Science, vol. 14 Issue 3, 2014, 6 pages.

Chia-Tsen Dai, et al., "ESD Protection Design with Stacked High-Holding-Voltage, SCR for High Voltage Pins in a battery Monitoring IC", IEEE Electron Device Letter, vol. 63, No. 5, May 2016, 7 pages.

Jung et al., "A Design of BJT-based ESD Protection Device combining SCR for High Voltage Power Clamps", Journal of Semiconductor Technology and Science, vol. 14, No. 3, Jun. 2014, 6 pages.

Do et al., "A New Dual-Direction SCR With High Holding Voltage and Low Dynamic Resistance for 5 V Application", Journal of the Electorn Devices Society, IEEE, vol. 7, May 31, 2019, 5 pages.

Liu et al., "Novel Silicon-Controlled Rectifier (SCR) for High-Voltage Electrostatic Discharge (ESD) Applications", IEEE, vol. 29, No. 7, Jul. 2008, 3 pages.

Wang et al., "Novel High Holding Voltage SCR with Embedded Carrier Recombination Structure for Latch-up Immune and Robust ESD Protection", Nanoscale Research Letters, 2019, 7 pages.

Dai et al., "ESD Protection Design with Stacked High-Holding-Voltage, SCR for High Voltage Pins in a battery Monitoring IC", IEEE, vol. 63, No. 5, May 2016, 7 pages.

Koo et al., "Analysis of SCR-Based ESD Protection Circuit on Holding Voltage Characteristics", International Scholarly and Scientific Research & Innovation, vol. 8, No. 7, 2014, 4 pages.

Office Action in U.S. Appl. No. 17/501,270 dated Jul. 11, 2023, 13 pages.

Office Action in U.S. Appl. No. 17/475,942 dated Aug. 8, 2023, 7 pages.

Notice of Allowance dated Nov. 20, 2023 in related U.S. Appl. No. 17/475,942, 10 pages.

Final Office Action dated Nov. 22, 2023 in related U.S. Appl. No. 17/501,270, 16 pages.

Taiwanese Office Action in TW Application No. 1111125135 dated Oct. 19, 2023, 7 pages.

Final Office Action in U.S. Appl. No. 17/501,270 dated Nov. 22, 2023, 16 pages.

Notice of Allowance in U.S. Appl. No. 17/475,942 dated Nov. 20, 2023, 10 pages.

Notice of Allowance dated Jan. 31, 2024 in related U.S. Appl. No. 17/501,270, 8 pages.

* cited by examiner

HIGH-VOLTAGE ELECTROSTATIC DISCHARGE DEVICES

FIELD OF THE INVENTION

The present disclosure relates to semiconductor structures and, more particularly, to high-voltage electrostatic discharge devices and methods of manufacture.

BACKGROUND

Electrostatic discharge (ESD) devices protect integrated circuits from the sudden flow of electricity caused by, for example, contact, electrical shorts or dielectric breakdown. ESD devices can thus protect integrated circuits from failure. ESD devices come in a variety of different structures such as resistors, fuses, etc.

ESD devices need to be in the ESD safe window with high current performance and high holding voltage (Vh) for high voltage applications. For example, the holding voltage needs to be higher than the operating voltage or the device will not turn off. In such a situation, the current will discharge and the integrated circuit can become damaged.

Meeting both high current performance and high holding voltage for high voltage ESD demand is very challenging, though. For example, there is typically a tradeoff between high current performance and high holding voltage. That is, conventional devices typically provide either high current performance or high holding voltage. Illustratively, a high voltage PNP can provide a relatively high holding voltage control but not a high current performance; whereas, a low voltage/high voltage silicon controlled rectifier (SCR) can provide relatively high current performance but not a high holding voltage control.

SUMMARY

In an aspect of the disclosure, a structure comprising a vertical silicon controlled rectifier (SCR) connecting to an anode, and comprising a buried layer of a first dopant type in electrical contact with an underlying continuous layer of a second dopant type within a substrate.

In an aspect of the disclosure, a structure comprises a vertical NPN in a substrate and connected to a cathode, the vertical NPN comprising a continuous layer of a first dopant type, a base of a second dopant type and an emitter of the first dopant type.

In an aspect of the disclosure, a method comprises forming a vertical silicon controlled rectifier (SCR) connecting to an anode, the vertical SCR comprising forming a buried layer of a first dopant type in electrical contact with a continuous layer of a second dopant type formed in a substrate.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to high-voltage electrostatic discharge (ESD) devices and methods of manufacture. More specifically, in exemplary embodiments, the high-voltage ESD device(s) comprises a vertical silicon controlled rectifier (SCR) combined with a vertical NPN device. Advantageously, the high-voltage ESD device provides high current performance for high-voltage applications, with relatively high holding voltage for high-voltage applications with keeping high current performance. In addition, the high-voltage ESD devices described herein save significant chip area compared to a structure with an equivalent performance.

The ESD devices of the present disclosure can be manufactured in a number of ways using a number of different tools. In general, though, the methodologies and tools are used to form structures with dimensions in the micrometer and nanometer scale. The methodologies, i.e., technologies, employed to manufacture the ESD devices of the present disclosure have been adopted from integrated circuit (IC) technology. For example, the structures are built on wafers and are realized in films of material patterned by photolithographic processes on the top of a wafer. In particular, the fabrication of the ESD devices uses three basic building blocks: (i) deposition of thin films of material on a substrate, (ii) applying a patterned mask on top of the films by photolithographic imaging, and (iii) etching the films selectively to the mask.

Figure 1A:
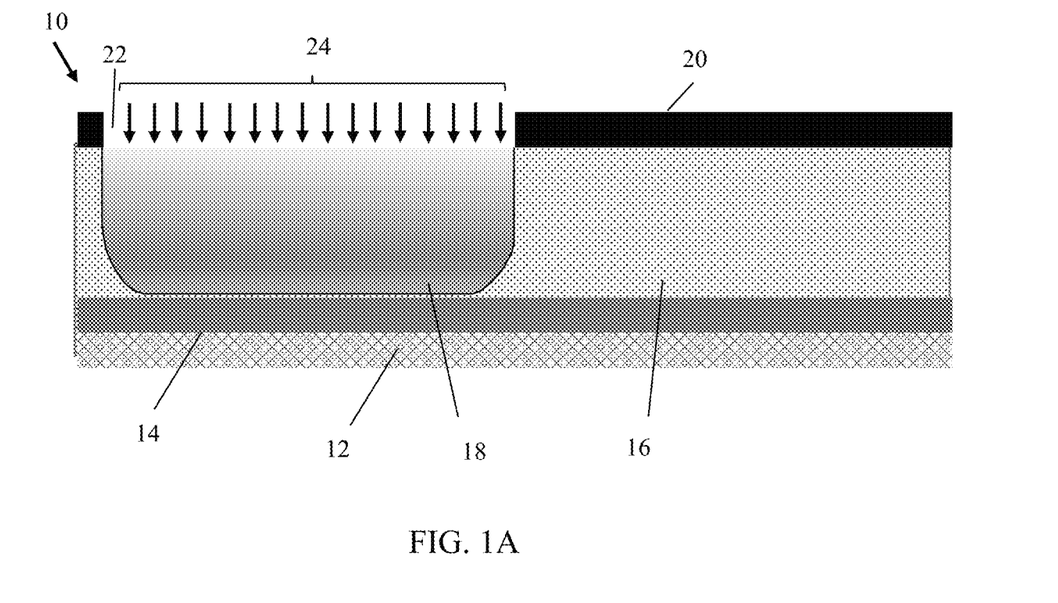
FIGS. 1A-1D show intermediate structures and a final structure comprising a high-voltage electrostatic discharge (ESD) device and respective fabrication processes in accordance with aspects of the present disclosure.

FIGS. 1A-1D show intermediate structures and a final structure of a high-voltage ESD device and respective fabrication processes in accordance with aspects of the present disclosure. In particular, FIG. 1A shows a structure 10 comprising a substrate 12. In embodiments, the substrate 12 may be composed of any suitable semiconductor material including, but not limited to, Si, SiGe, SiGeC, SiC, GaAs, InAs, InP, and other III/V or II/VI compound semiconductors.

The substrate 12 includes an n+ region 14. In embodiments, the n+ region 14 may be an n+ buried layer (NBL) formed by introducing a dopant by, for example, using an ion implantation process. In embodiments, the NBL may be a continuous collector NBL. In the ion implantation process, the n+ region 14 may be formed by introducing a concentration of a dopant of n+ dopant type in the substrate 12 using a patterned implantation mask to define selected areas exposed for the implantation. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. The continuous n+ region 14 may be doped with n-type dopants, e.g., Arsenic (As), Phosphorus (P) and Sb, among other suitable examples, at a dopant dose concentration of approximately $1E18$ $cm^{-3}$ to $5E20$ $cm^{-3}$.

Still referring to FIG. 1A, an epitaxial semiconductor material 16 may be grown on the substrate 12. In embodiments, the epitaxial semiconductor material 16 may be an n+ type semiconductor material. In alternative embodiments, the substate 12 may be thicker so that the upper portion may undergo an ion implantation process with an n+ type dopant, e.g., at a concentration of approximately 1E15 $cm^{-3}$ to 5E17 cm'. In either scenario, the semiconductor material 16 may be used for a deep N-well structure as described in more detail herein.

A p-well 18 may be formed within the semiconductor material 16, which is in electrical contact with the n+ region 14. In embodiments, the p-well 18 is a high-voltage p-well formed using p-type dopants, e.g., Boron (B). As with any of the well regions described herein, the high-voltage p-well 18 may be formed by deposition of an implantation mask 20 (similar to the mask described above), followed by a patterning process to form an opening 22 and, thereafter, an ion implantation process of certain dopant type, e.g., p-type dopant for the p-wells, shown representatively by arrows 24, e.g., at a concentration of approximately 4E16 cm' to 2E18 $cm^{-3}$.

Figure 1B:
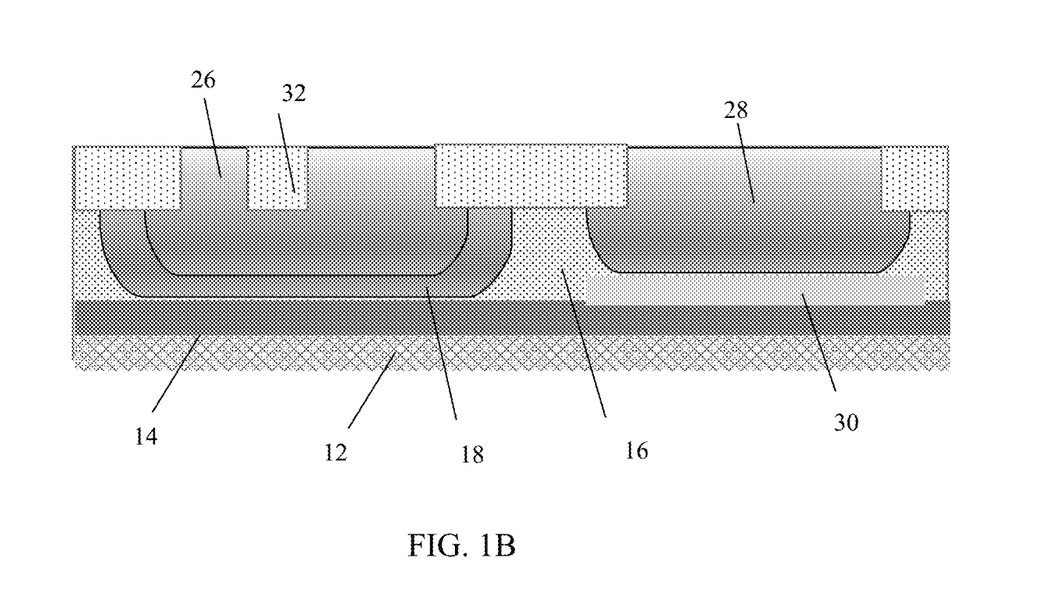

Referring to FIG. 1B, a p-well 26 may be formed in the p-well 18. In embodiments, the p-well 26 may be a p-type high-voltage double diffusion drain (HVPDDD), formed using an ion implantation process with an appropriate implantation mask as already described herein such that no further explanation is required for a complete understanding of the present disclosure. In embodiments, the p-well 18 may have a dopant dose concentration of, e.g., approximately 1E16 $cm^{-3}$ to 4E18 $cm^{-3}$.

An n-well 28 may be formed in the substrate 16, remote from the p-wells 18, 26. In other words, the n-well 28 may be separated from the p-wells 18, 26 by the substrate 16. In embodiments, the n-well 28 may be an n-type high-voltage double diffusion drain (HVNDDD) formed by using an ion implantation process with an appropriate implantation mask as already described herein. In embodiments, the n-well 28 may have lower dopant dose concentration to control breakdown voltage, e.g., of approximately 5E15 $cm^{-3}$ to 4E18 $cm^{-3}$.

A p-buried layer 30 may formed below the n-well 28. In embodiments, the p-buried layer 30 makes contact (e.g., electrical contact) to both the n+ region 14 and the n-well 28. The p-buried layer 30 may be formed using an ion implantation process with a dopant dose concentration of, e.g., approximately 1E16 cm' to 1E19 cm'.

FIG. 1B further shows shallow trench isolation structures 32 in the wells 26, 28 and spanning between the wells 34, 36. The shallow trench isolation structures 32 can be formed by conventional lithography, etching and deposition methods known to those of skill in the art. For example, a resist formed over the substate 16 is exposed to energy (light) to form a pattern (opening). An etching process with a selective chemistry, e.g., reactive ion etching (RIE), will be used to form one or more trenches in the substrate 16 through the openings of the resist. Following the resist removal by a conventional oxygen ashing process or other known stripants, insulator material, e.g., oxide, can be deposited in the trenches by any conventional deposition processes, e.g., chemical vapor deposition (CVD) process, to form the shallow trench isolation structures 32. Any residual insulator material on the surface of the substrate 16 can be removed by conventional chemical mechanical polishing (CMP) processes. In embodiments, the lateral dimension of the shallow trench isolation region spanning between the wells 34, 36 may be adjusted to provide a high DC breakdown voltage and prevention of a lateral SCR.

Figure 1C:
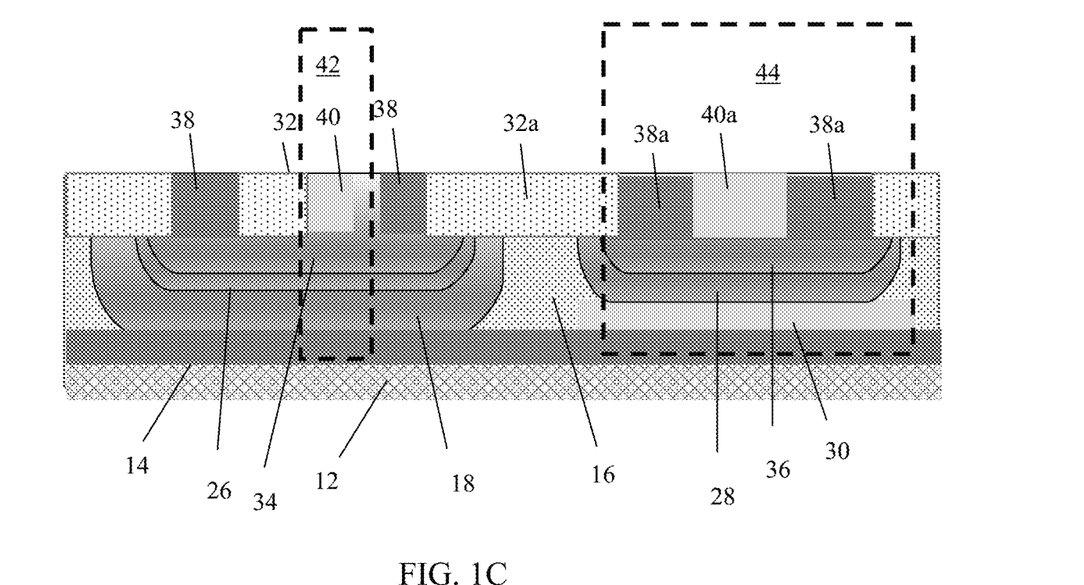

In FIG. 1C, a p-well 34 and an n-well 36 may be formed in the substrate 16. More specifically, the p-well 34 may be formed in the p-well 26 and the n-well 36 may formed in the n-well 28. Again, the wells 34, 36 may be formed by conventional ion implantation processes with appropriate dopant types at a dopant dose concentration of, e.g., approximately 1E17 $cm^{-3}$ to 1E19 $cm^{-3}$. In addition, p+ doped region 38 and n+ doped region 40 may be formed in the p-well 34; whereas, p+ doped regions 38a and n+ doped region 40a may be formed in the n-well 36 using respective p-type dopants and n-type dopants. In embodiments, the doped region 40 may be an emitter region. Also, the combination of the p-well 34, p-well 26 and p-well 18 may be a p-type base region. The p+ doped region 38 and n+ doped region 40 may be doped at a higher dopant concentration, e.g., 5E19 $cm^{-3}$ to 5E21 $cm^{-3}$. The structure may undergo a thermal process (e.g., rapid thermal process) for dopant activation and diffusion.

It should be recognized that the combination of regions 40, 34, 26, 14, 18 form a vertical NPN device 42. Also, the combination of regions 38a, 40a, 36, 28, 30 and 14 form a vertical PNPN silicon controlled rectifier (SCR) device 44. In embodiments, the NPN device 42 and the PNPN SCR device 44 are separated by the shallow trench isolation region 32a. In embodiments, the space between the isolation region 32a may be large, e.g., approximately 10 μm or larger, to provide a high DC breakdown voltage and prevention of a lateral SCR. In embodiments, the lateral SCR can lead to high density of current flow due to a narrow current path.

Also, the NPN region 42 will be on a cathode side of the device; whereas, the PNPN SCR 44 will be on the anode side of the device. Moreover, both of these devices 42, 44 will be electrically connected together through the n+ region 14, e.g., continuous NBL collector. And, by using the p-buried layer 30, the PNPN SCR 44 can have a current performance of approximately 80 mA/um, which is a relatively high current to provide improved performance and high holding voltage (Vh) compared to a conventional high voltage NPN SCR. In addition, by increasing the distance between the wells 34, 36, it is also possible to control voltage breakdown.

Figure 1D:
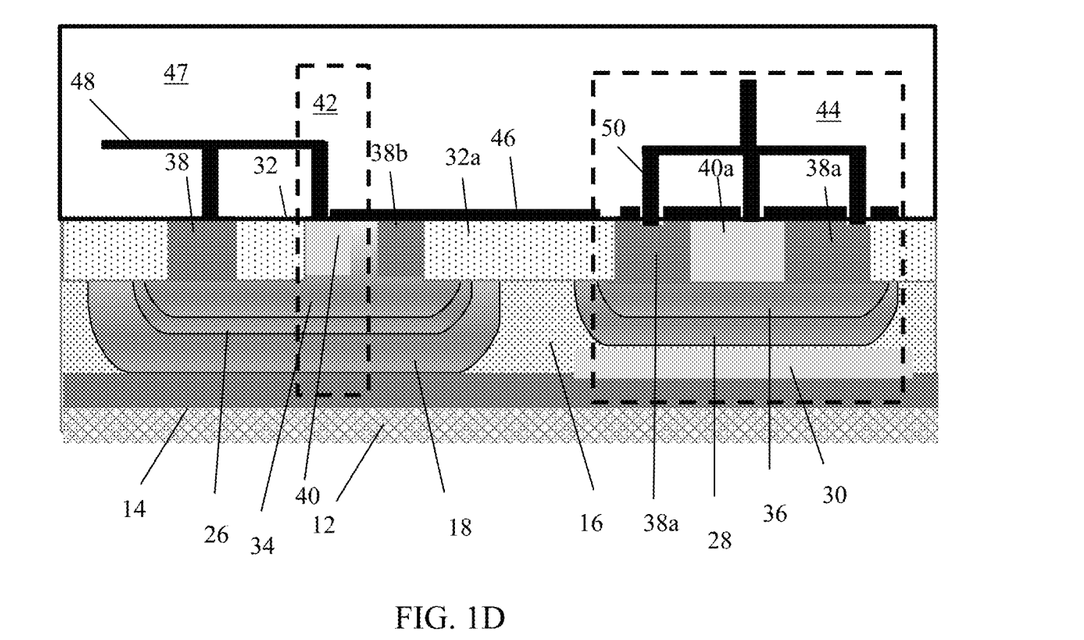

As further shown in FIG. 1D, a cathode 48 connects to the NPN device 42 and an anode 50 connects to the PNPN SCR device 44. Prior to forming contacts of the cathode 48 and anode 50, a silicide block layer 46 may formed over portions of the structure including, e.g., completely blocking the p+ doped region 38b of the NPN device 42. A silicide process may then be performed to form silicide on the remaining active regions 38, 38a, 40 and 40a. The contacts of the cathode 48 and anode 50 are composed of metal contacts.

As should be understood by those of skill in the art, the silicide process begins with deposition of a thin transition metal layer, e.g., nickel, cobalt or titanium, over fully formed and patterned devices (e.g., doped or ion implanted regions 38, 38a, 40, 40a). After deposition of the material, the structure is heated allowing the transition metal to react with exposed silicon (or other semiconductor material as described herein) in the active regions of the device (e.g., doped or ion implanted regions 38, 38a, 40, 40a) forming a low-resistance transition metal silicide. Following the reaction, any remaining transition metal is removed by chemical etching, leaving silicide contacts in the active regions of the device. The non-silicided p+ doped region 38b will be a floating high p-type doping area between the cathode 48 and the shallow trench isolation region 32a, adjacent to the anode 50. In embodiments, the mask to prevent the p+ doped region 38b from being silicide will prevent the formation of a lateral SCR for high voltage (Vh) control. Also, by adjusting the width of the p+ doped region 38b, it is possible to prevent lateral SCR action, make current flow in the vertical direction through the PNPN and NPN portions of the device, and hence increase holding voltage.

Following the silicide process, an insulator material 47 may be formed over the structure using a conventional deposition process of oxide material, e.g., chemical vapor deposition (CVD) processes. The insulator material 47 undergoes a conventional etching (RIE) process to form openings exposing the silicide of the regions 38, 40, 38a, 40a. Thereafter, contact metal(s), e.g., aluminum, tungsten, etc., may be deposited within openings of the insulator material 47 to form the contacts for the cathode 48 and the anode 50. In embodiments, the contacts of the cathode 48 are in direct contact with the doped regions 38, 40 and the contacts of the anode 50 are in direct contact with doped regions 38a, 40a.

Figure 2:
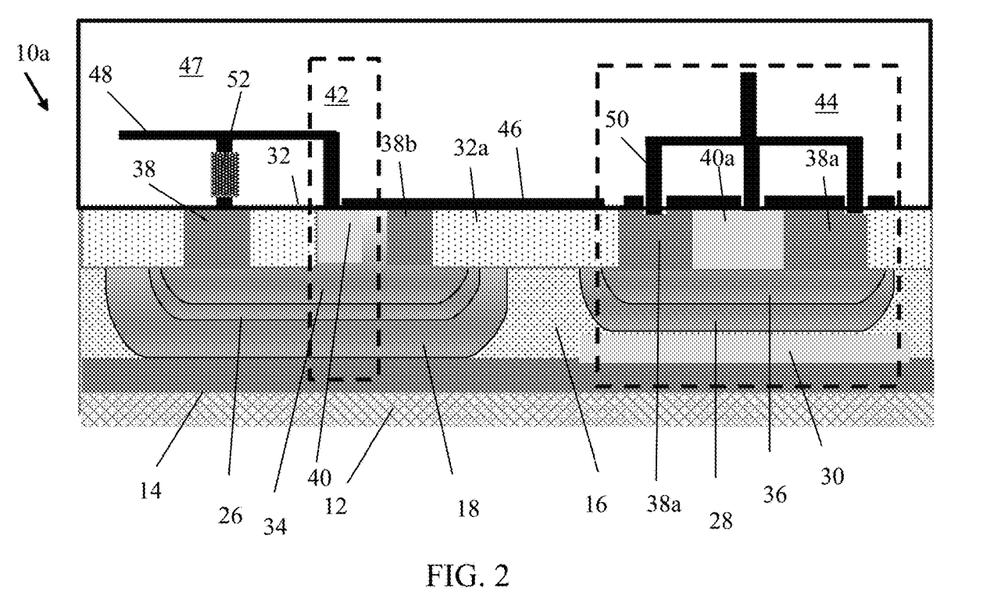
FIG. 2 shows an ESD device in accordance with additional aspects of the present disclosure.

FIG. 2 shows an ESD device in accordance with additional aspects of the present disclosure. In particular, the ESD device 10a of FIG. 2 includes a resistor 52 on the contact of the cathode 48. For example, the resistor 52 may be provided on the contact plug for the p+ region 38. In embodiments, the resistor 52 may be a base resistor with a resistance of, e.g., 10 kohm, which enables fast triggering.

Figure 3:
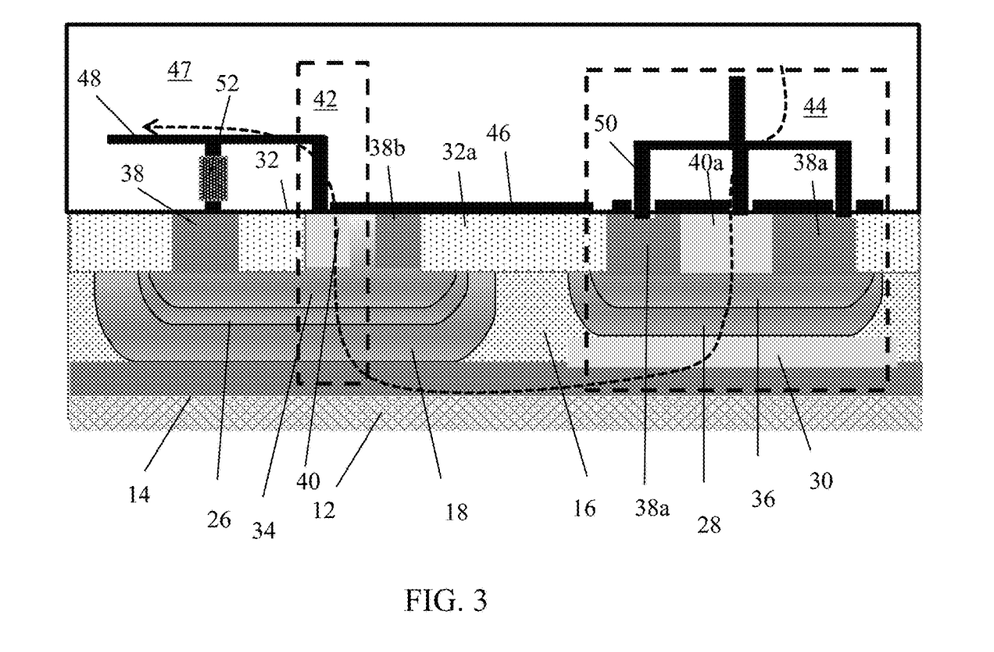
FIG. 3 representatively shows an electrical current flow through the ESD device of FIG. 2.

FIG. 3 representatively shows an electrical current flow through the device of FIG. 2. In particular, the electric current flow is representative shown by the dashed arrow, as it passes from the anode side of the device to the cathode side of the device. In embodiments, the current flow will be through both the PNPN SCR device 44 and NPN device 42, by having the current passing through the n+ buried layer 14 (e.g., continuous collector NBL). It should be recognized by those of ordinary skill in the art that the current flow will be similar in any of the devices described herein, e.g., from the anode of the side of the PNPN SCR device through the n+ buried layer 14 and to the cathode on the side of the NPN device.

Figure 4:
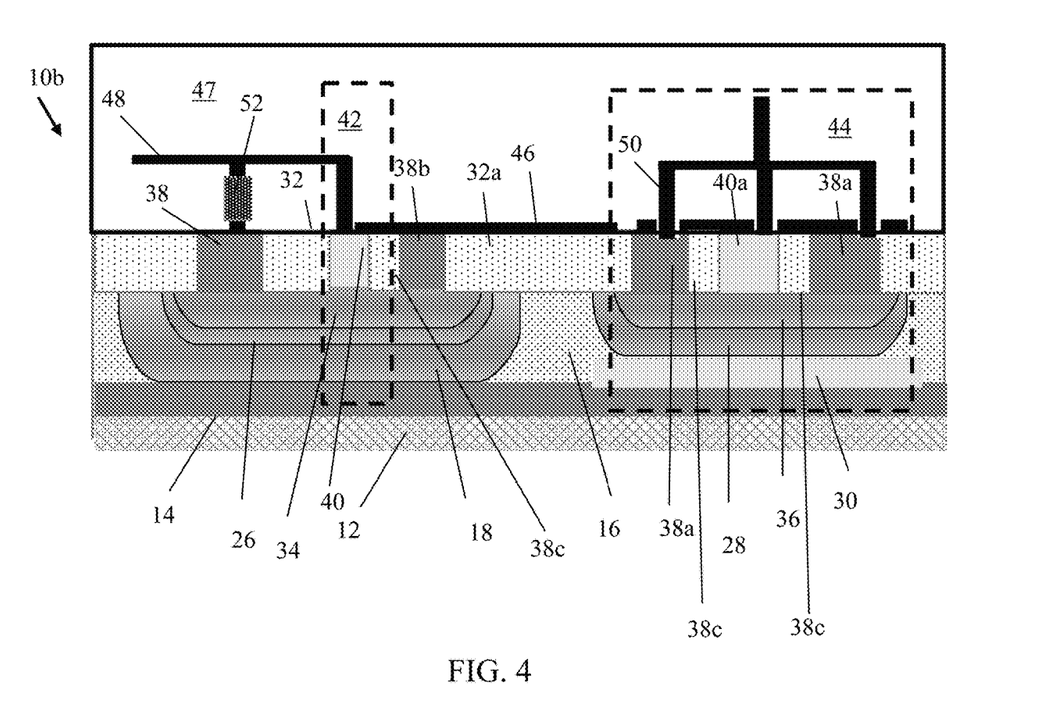
FIGS. 4-6 show differently configured ESD devices in accordance with additional aspects of the present disclosure.

FIG. 4 shows an ESD device in accordance with further aspects of the present disclosure. In the ESD device 10b of FIG. 4, shallow trench isolation structures 38c are located at both the side of the cathode 48 and the anode 50. More specifically, in embodiments, the shallow trench isolation structures 38c are located in the p-well 34, between the regions 38b and 40. In additional, the shallow trench isolation structures 38c are located in the n-well 36, between regions 38a and 40a. As should be understood by those of skill in the art, the shallow trench isolation structures 38c may reduce current voltage, which result in a faster turn on of the device. The remaining features are the same as with respect to FIG. 1D or 2.

Figure 5:
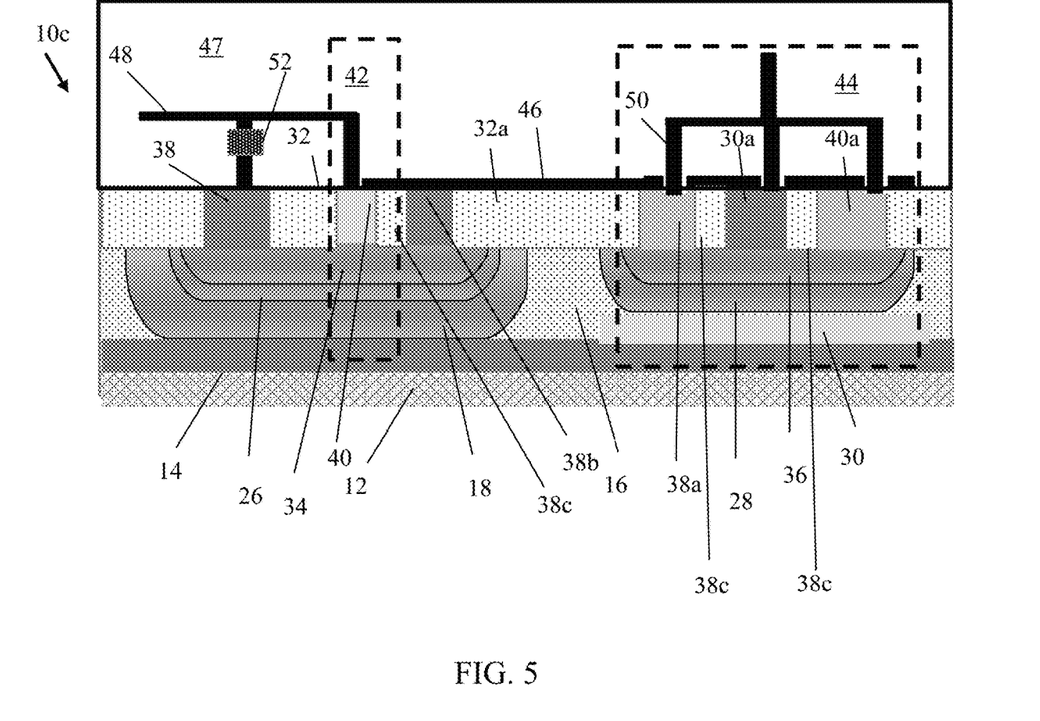

FIG. 5 shows an ESD device in accordance with further aspects of the present disclosure. In the ESD device 10c of FIG. 5, the p+ region 30a is provided between the n+ regions 40 within the well region 36 of the side of the anode 40. In this way, the p+ region 30a is in the middle of two n+ regions 40, separated by the shallow trench isolation structures 38c. In further embodiments, the shallow trench isolation structure can be eliminated. The remaining features are the same as with respect to FIG. 1D or 2.

Figure 6:
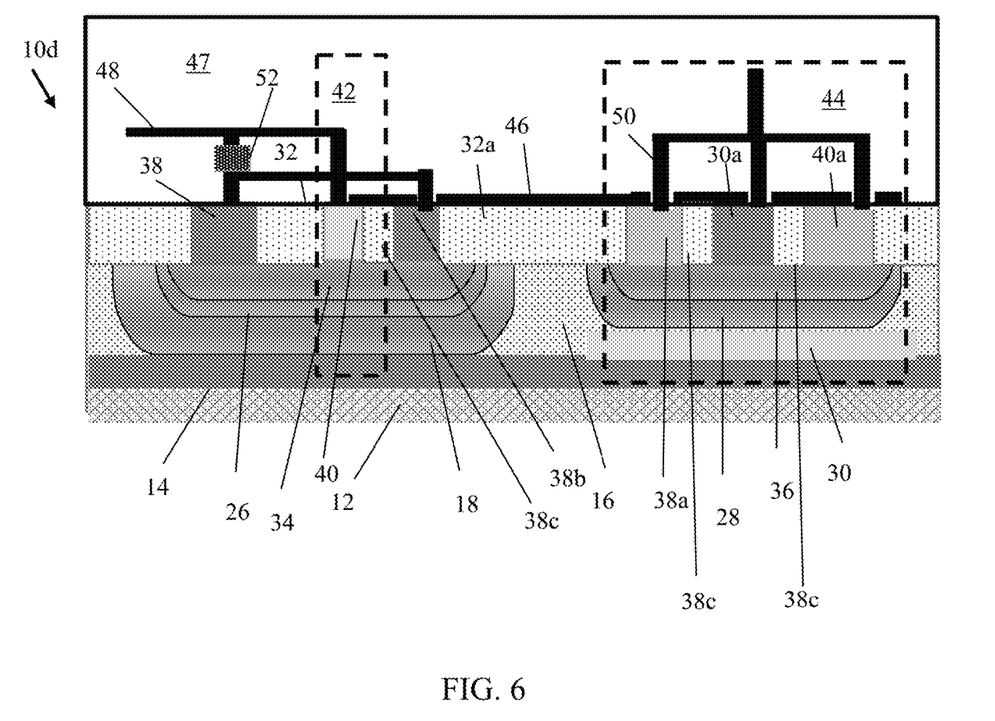

FIG. 6 shows yet another ESD device in accordance with aspects of the present disclosure. In the ESD device 10d of FIG. 6, the p+ region 38b may be connected to the p+ region 38, below the resistor 32. In this way, the p+ region 38b is no longer a floating diffusion region. Also, as should be recognized by one of ordinary skill in the art, the p+ region 38b will undergo a silicide process. The remaining features are the same as with respect to FIG. 1D or 2.

The ESD devices can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a vertical silicon controlled rectifier (SCR) connecting to an anode, and comprising a buried layer of a first dopant type in electrical contact with an underlying continuous layer of a second dopant type within a substrate, wherein the first dopant type comprises a p-type dopant, the second dopant type comprises an n-type dopant and the underlying continuous layer extends to a vertical NPN device connecting to a cathode and which comprises a p-type base, an n-type emitter and the underlying continuous layer.

2. The structure of claim 1, further comprising a base resistor connected between the vertical NPN device and the cathode.

3. The structure of claim 1, wherein the vertical NPN device includes a floating p+ region within a p-well of the vertical NPN device.

4. The structure of claim 3, wherein the p+ regions are separated from the n+ region by shallow trench isolation structures.

5. A structure comprising a vertical silicon controlled rectifier (SCR) connecting to an anode, and comprising a buried layer of a first dopant type in electrical contact with an underlying continuous layer of a second dopant type within a substrate, wherein the vertical SCR comprises a vertical PNPN SCR comprising p+ regions and an n+ region within an n-well.

6. A structure comprising a vertical silicon controlled rectifier (SCR) connecting to an anode, and comprising a buried layer of a first dopant type in electrical contact with an underlying continuous layer of a second dopant type within a substrate, wherein the vertical SCR comprises n+ regions and a p+ region between the n+ regions, each of which are within an n-well.

7. The structure of claim 6, wherein the n+ regions are separated from the p+ region by shallow trench isolation structures.

8. A structure comprising:
a vertical NPN in a substrate and connected to a cathode, the vertical NPN comprising a continuous layer of a first dopant type, a base of a second dopant type and an emitter of the first dopant type;
a vertical silicon controller rectifier (SCR) which shares the continuous layer of the first dopant type; and
a shallow trench isolation structure between and separating the vertical SCR and the vertical NPN.

9. The structure of claim 8, wherein the first dopant type comprises an n-type dopant and the second dopant type comprises a p-type dopant.

10. The structure of claim 8, wherein the vertical SCR comprises a vertical PNPN SCR.

11. The structure of claim 10, wherein the vertical PNPN SCR comprises a buried p+ layer within an n-type substate and connected to the continuous layer of the first dopant type.

12. The structure of claim 8, wherein the vertical SCR comprises an n+ dopant region and p+dopant regions.

13. A structure comprising a vertical NPN in a substrate and connected to a cathode, the vertical NPN comprising a continuous layer of a first dopant type, a base of a second dopant type and an emitter of the first dopant type, wherein the vertical NPN includes a non-silicided floating p-type diffusion region.

14. A structure comprising a vertical NPN in a substrate and connected to a cathode, the vertical NPN comprising a continuous layer of a first dopant type, a base of a second dopant type and an emitter of the first dopant type, wherein the vertical NPN includes two silicided p-type diffusion regions electrically connected to the cathode.

15. A structure comprising a vertical NPN in a substrate and connected to a cathode, the vertical NPN comprising a continuous layer of a first dopant type, a base of a second dopant type and an emitter of the first dopant type, further comprising a base resistor connected between the vertical NPN device and the cathode.

16. A method comprising forming a vertical silicon controlled rectifier (SCR) connecting to an anode, the vertical SCR comprising forming a buried layer of a first dopant type in electrical contact with a continuous layer of a second dopant type formed in a substrate, wherein the first dopant type comprises a p-type dopant, the second dopant type comprises an n-type dopant and the underlying continuous layer extends to a vertical NPN device connecting to a cathode and which comprises a p-type base, an n-type emitter and the underlying continuous layer.

* * * * *